United States Patent [19]
LeFevre

[11] Patent Number: 5,668,500
[45] Date of Patent: Sep. 16, 1997

[54] CMOS BUFFER AMPLIFIER

[75] Inventor: David LeFevre, Redondo Beach, Calif.

[73] Assignee: Hughes Electronics

[21] Appl. No.: 569,637

[22] Filed: Dec. 8, 1995

[51] Int. Cl.$^6$ .................... H03F 3/45; H01L 31/00
[52] U.S. Cl. .................. 330/253; 250/330; 330/255; 330/257
[58] Field of Search .................. 330/253, 255, 330/257; 250/330, 332

[56] References Cited

U.S. PATENT DOCUMENTS

| | | | |
|---|---|---|---|
| 4,829,266 | 5/1989 | Pernici et al. | 330/253 |
| 4,881,044 | 11/1989 | Kinoshita et al. | 330/253 |
| 5,202,645 | 4/1993 | Phan et al. | 330/253 |
| 5,412,309 | 5/1995 | Ueunten | 330/257 |

*Primary Examiner*—James B. Mullins
*Attorney, Agent, or Firm*—Gordon R. Lindeen, III; Michael W. Sales; Wanda K. Denson-Low

[57] ABSTRACT

A thermal weapon sight employs a rotating multifaceted scan mirror (22) to reflect infrared light (14) from an object to a bank of CCD detectors (50) of which the output is multiplexed (80) and compensated for overall and individual sensor deviations. The compensated output, after suitable signal processing (86), is employed to drive an LED array (62) that projects visible light to different facets of the same scanning mirror (22) to provide a visible output (14') representing the infrared input obtained from the object being viewed. A compensation circuit includes a series of digital analog converters (208a–208m) having a bank of switched capacitors (234a–234m) for which a voltage reference is provided by a CMOS voltage buffer (220) having fast recovery time, and which is able to drive the large capacitative load. The voltage buffer includes a two stage differential amplifier (270) having a pair (274) of larger FETs to strip most of the current of a first stage input differential pair (270) and having a pair of smaller active load FETs (272). A second stage differential amplifier (276) is driven by the first stage differential pair and is connected to drive current boost circuit (280) to increase the total current available. The second stage drives a differential to single ended converter (278) and a second current boost circuit 282. The second stage, converter and both boost circuits connected to a converter output node to drive the large capacitative load. The output node is also connected to the input of one of the differential pair of the first stage.

26 Claims, 6 Drawing Sheets

CMOS BUFFER AMPLIFIER

This invention was made with support from the United States Government under contract number DAAB07-91-C-K254 awarded by the Department of the Army. The U.S. Government has certain rights in this invention.

BACKGROUND OF THE INVENTION

1. Field of the Invention

The present invention relates to CMOS amplifiers, and more particularly concerns a CMOS buffer reference amplifier uniquely adapted for driving a large switched capacitative load. Although the present invention has a variety of other applications, it has been particularly designed for use in a compensation circuit of an imaging device in which invisible infrared light from a scene is employed to provide a visible light image that replicates the scene.

2. Description of Related Art

Night vision devices have been available for many years. One category of these conventional night vision devices uses image intensifier technology. This technology is effected using a device generally known as an image intensifier tube. These image intensifier night vision devices require some residual light, such as moon or star light, in which to operate. This light is generally rich in near-infrared radiation, which is invisible to the human eye.

Another category of conventional night vision device is represented by the cryogenically cooled focal plane array thermal imaging devices. These devices use a photoelectrically responsive detector which is cooled to a temperature in the cryogenic range to reduce unwanted thermal noise.

A significant disadvantage of this category of night vision device is the requirement for cryogenic cooling of the detector. However, such coolers require a considerable amount of power, are not without their own maintenance and reliability problems, and are generally noisy.

Image intensifier systems, focal plane array systems, infrared imaging systems of the type described below, and many other types of systems include extensive signal processing circuits that employ reference circuits designed for large capacitative loads. For example, such commonly used circuits as groups of digital to analog converters used in certain signal processing of imaging systems often employ large banks of switched capacitors for establishing voltage levels. Drivers for such large capacitative loads have usually employed bi-polar design techniques. Designs employing CMOS circuitry have exhibited inadequate performance. Prior capacitative load driving circuits fail to have sufficiently low quiescent current, particularly when required to provide high output peak currents for large capacitive loads. Settling times have been unsatisfactory, which may limit speed of operation.

Accordingly, it is an object of the present invention to provide a voltage buffer amplifier that avoids or minimizes above-mentioned problems.

An additional object is to provide such an amplifier having a fast recovery time when employed with a large capacitative load.

Still another object of the invention is to provide a voltage reference for a large capacitative load of an imaging system that has low quiescent current.

SUMMARY OF THE INVENTION

A CMOS amplifier includes an input pair of field effect transistors, an active load connected with the transistors, a current strip circuit connected with the input pair for providing a path for a major portion of current flowing through the input pair, and an output terminal connected with the active load.

According to another feature of the invention, current boosting circuit means are connected between the active load and the output terminal.

As still another feature of the invention, a second stage amplifier is connected to be driven by the active load of the input pair.

According to another feature of the invention, a differential to single ended converter is driven by the second stage and itself drives a current boost circuit, whereby current outputs are provided to the output terminal from current boost circuits, the second stage and the differential to single ended converter.

According to another feature of the invention, the CMOS buffer amplifier is employed in a thermal imaging system to drive large capacitative loads of signal processing circuits in the system.

DESCRIPTION OF PREFERRED EMBODIMENTS

An unique CMOS voltage buffer amplifier to be described herein provides high current spikes into a large capacitative load with a fast recovery time and very low quiescent current. Such an amplifier has many applications which will be apparent to those skilled in the art. However, because the amplifier has been initially designed for use in a thermal weapon system (a night vision gun sight), such a system will first be described, without intending to limit application of the invention, but to illustrate one specific embodiment.

Thermal Imaging System

Figure 1:
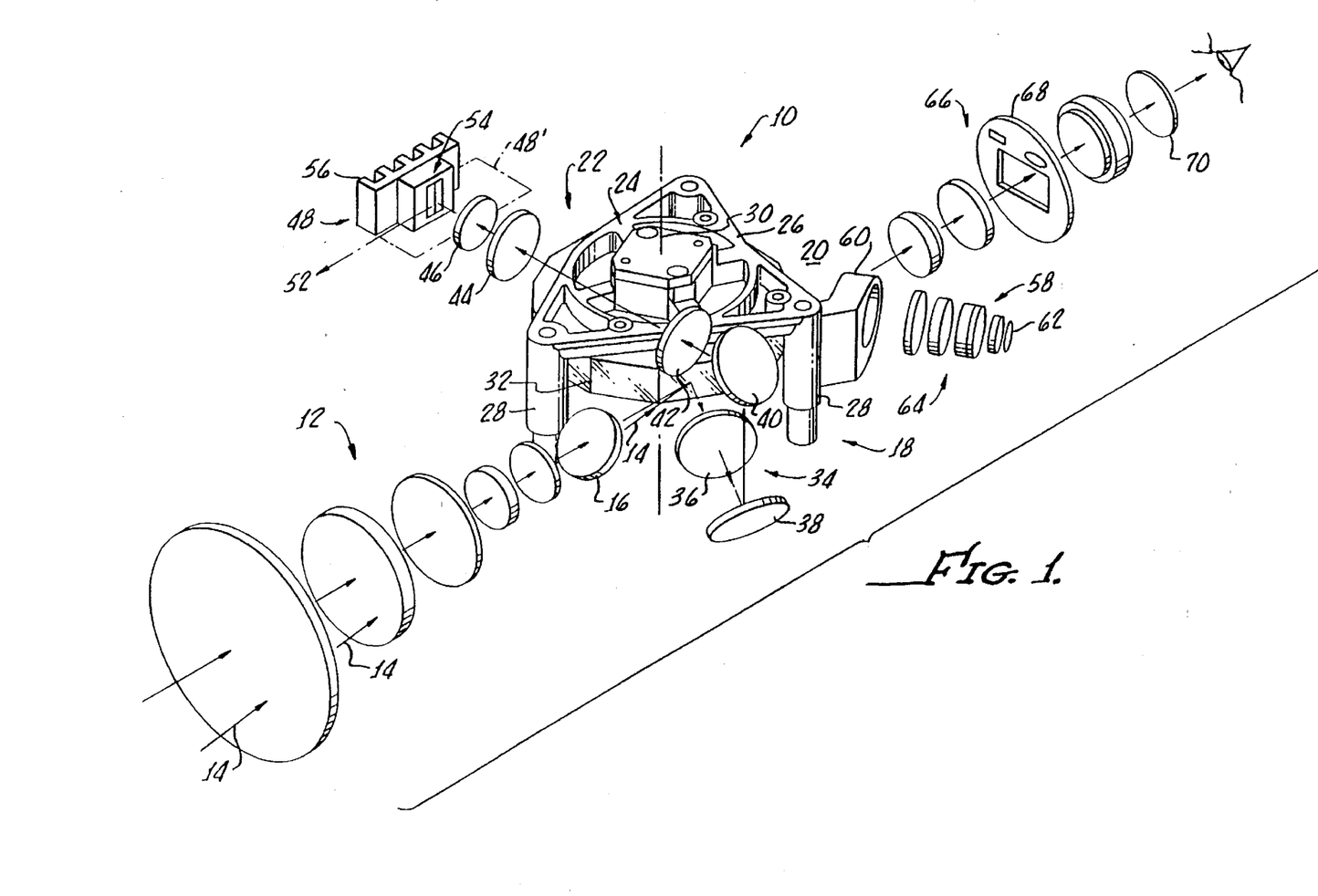
FIG. 1 is a diagrammatic representation of the functionally cooperating physical components of a thermal imaging device embodying the present invention.

Referring to FIG. 1, a thermal imaging device 10 is diagrammatically depicted with its functionally cooperative physical components suspended in space without the depiction of a supporting housing (which housing is, of course, included in a physical embodiment of the device), so that these components and a ray-tracing diagram for light rays in the device can also be presented. The thermal imaging device includes an objective optics group, generally indicated with the numeral 12. This objective optics group includes several lenses (indicated with reference numerals 12', 12", 12''', etc.), which lenses are transparent to light in the spectral band of interest (but not necessarily transparent to visible light). The objective optics group 12 is pointed toward a scene to be viewed, so that infrared light from this scene (indicated with the arrowed numeral 14) can be received and focused by this optics group. It will be understood that the objective optics group 12 seen in FIG. 1 is representative only, and that this optics group may be removed and replaced with objective optics of differing configurations, as will be further described. The objective optics group 12 concentrates and columnates received light through a window 16, which window is a permanent part of a basic sensor portion 18 of the device 10. In conjunction with the housing (to be described below) of this basic sensor portion 18, this window 16 bounds a sealed chamber 20 in which are received almost all of the remaining components of the device 10 as illustrated in FIG. 1.

Within the housing chamber 20 is received a scanner, generally referenced with the numeral 22. This scanner 22 includes a scanner frame 24, which is generally of triangular or tripod configuration in plan view. The scanner frame 24 includes a generally triangular upper wall portion 26, and three depending leg portions 28, only two of which are visible in FIG. 1. Carried by the wall portion 26 is a scanner motor, generally indicated with the numeral 30. This scanner motor 30 includes a generally vertically extending rotational drive shaft (not visible in the drawing Figures) drivingly carrying a disk-like circular multi-faceted scanning mirror 32. The scanning mirror 32 includes plural outwardly and circumferentially disposed adjacent facets or faces 32a, 32b, etc. only a few facets of which are seen in any one of the drawing Figures. This scanning mirror 32 rotates in a generally horizontal plane to reflect light 14 received via the window 16 and objective optics group 12 to an image optics group, generally indicated with the numeral 34. It will be noted that because of rotation of the scanning mirror 32, the facets 32a, 32b, etc., continually change their angulation in the horizontal plane with respect to the scene viewed via the objective optics group 12.

Considering the image optics group 34 in greater detail, it is seen that light (arrow 14) reflected from a facet of the scanning mirror 32 passes through a lens 36 and to a pair of vertically spaced angulated mirrors 38, and 40. The mirror 40 reflects this light through an additional pair of lenses 42, and 44 toward a window 46 carried by a Dewar vessel 48. The Dewar vessel 48 includes a thermally insulative housing, generally indicated with the dashed line and the reference numeral 48'. This Dewar vessel 48 houses a linear focal plane infrared detector 50 having a linearly-arrayed multitude of small infrared detector elements, indicated collectively on FIG. 1 with the vertical line 50' on detector 50. Each of the detector elements 50' of the detector 50 provides a corresponding one of a like multitude of analog electrical signals each of which has a magnitude that is indicative of the flux level of infrared light falling on the particular detector element. These electrical signals are provided outwardly of the Dewar vessel 48 by an electrical interface (to be further described), and indicated on FIG. 1 with the dashed line 52.

In order to cool the detector 50 to a sufficiently low temperature that thermally excited electrons (as opposed to electrons excited by photons of infrared light falling on the detector 50) do not cause an undesirably high level of electrical noise which would hide the desired photoelectric image signal, the Dewar vessel 48 includes a multi-stage reversed Peltier-effect (i.e., thermoelectric) cooler 54. The thermoelectric cooler 54 has a chilling face to which the detector 50 is mounted to be cooled, and a heating face in heat transfer relationship with a heat sink schematically indicated with the numeral 56. In the physical embodiment of the imaging device 10, the heat sink 56 is defined by a metallic portion of the housing for the device 10 as will be seen.

It will be understood that because of the continuous change in angulation of each facet 32a, 32b, etc., of the scanning mirror 32 as this mirror rotates in a horizontal plane, the scene reflected from each particular facet sweeps horizontally across the linear array of detector elements 50' (i.e., perpendicularly to the vertical linear array of these detector elements). The detector elements responsively provide electrical signals (via interface 52) which are indicative of the flux levels of infrared light falling on corresponding ones of the plural detector elements 50' from a particular part of the scene during any one sweep of a scene portion across the detector 50.

Figure 2:
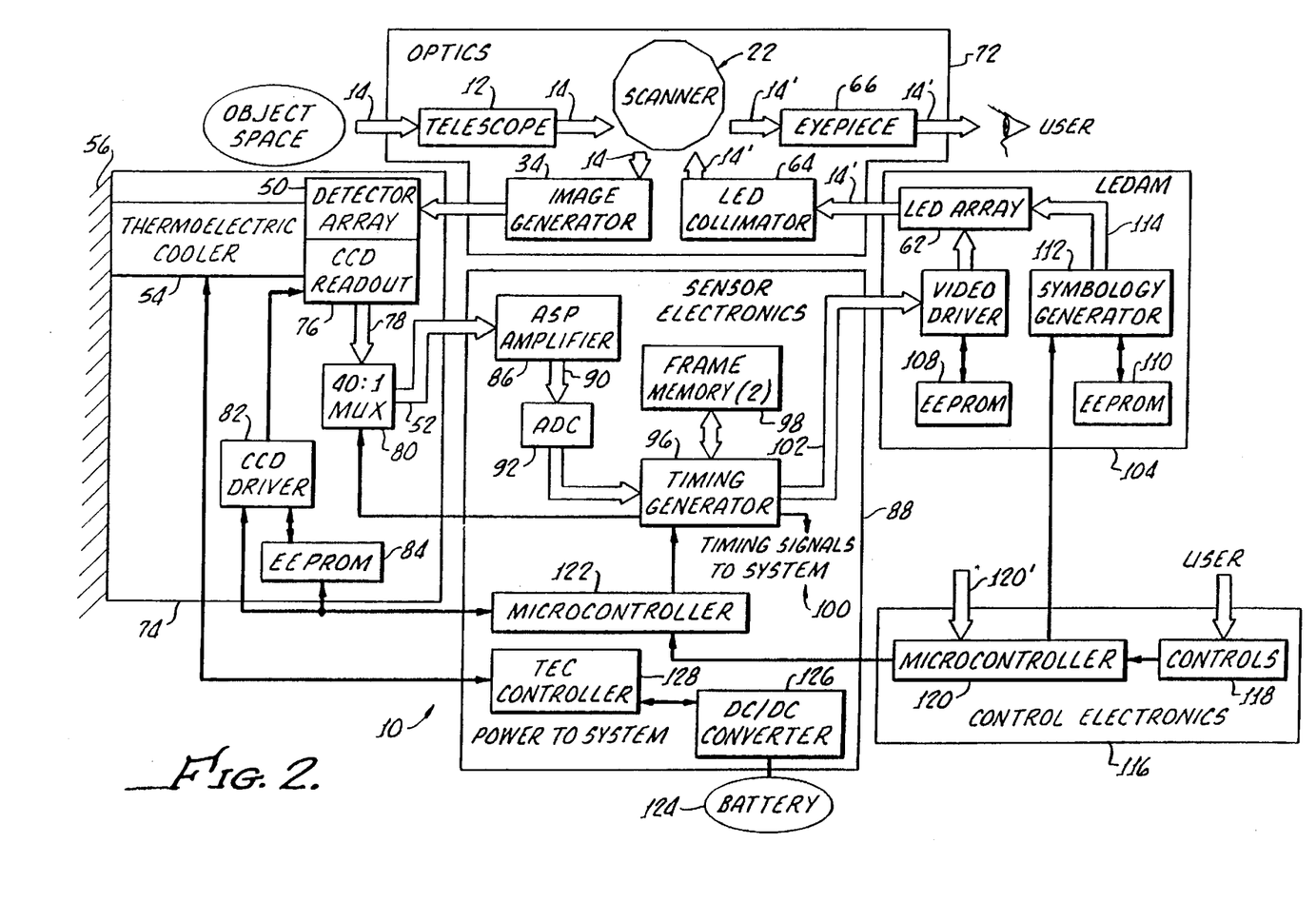
FIG. 2 is a schematic block diagram of a thermal imaging device embodying the present invention.

In order to provide a visible image to be viewed by a user of the imaging device 10, a light emitting diode (LED) projection array module 58 is carried by an apertured flange portion 60 of the scanner frame 26. This LED projection array module 58 includes a linear LED array 62, which array includes a multitude of individual LED's (not visible in FIG. 1), each individually emitting visible light when energized. The LED's of the array 62 are arrayed linearly along a vertical line similarly to the linear arrangement of the detector elements of the detector 50. The LED's provide respective portions of a visible image, as will become apparent. Light from the LED's is columnated and projected by a projection lens group, generally indicated with the numeral 64, onto a facet of the mirror 32, and as indicated by the arrowed reference numerals 14' (FIG. 2). The numerals 14 and 14', respectively, are used to denote the invisible infrared light carrying image information from a scene, and the visible light replicating the scene for viewing by a user of the device 10.

From the mirror 32 (i.e., from a particular facet 32' of this mirror) the visible light from the LED's is reflected to an ocular lens group, generally indicated with the numeral 66. The ocular lens group 66 includes several individual lenses. Along with these lenses, a status display unit 68 (FIG. 1) is interposed in the ocular lens group 66. This status display unit 68 defines an aperture through which the visible image is perceived, and includes several individual LED's which when illuminating are peripherally visible to the user of the device 10. Finally, the imaging device 10 includes a pair of eyepiece shutters 70. These shutters 70 are biased closed to prevent light emanations from the device 10 when a user's face is not pressed against a movable eyepiece member (to be described below). When the user presses against the movable eyepiece member, the shutters 70 open to allow the user to view the visible light image provided by the LED projection display module and the spinning mirror 32.

A schematic functional block diagram of the thermal imaging device 10 is presented in FIG. 2. Thermal image device 10 is divided into functionally modular portions, as is indicated by the dashed-line boxes encircling the various components of the device, with some of the modules including several sub-modules or components. The module 72 manages both invisible and visible light, and includes the objective optics group 12 receiving the invisible infrared light 14 from a scene to be viewed, the scanner 22, and image optics group 34 directing this invisible light to the detector 50. This light management module 72 also receives visible light from the LED array 62, and includes the projection lens group 64 projecting this light to the scanner 22, and ocular lens group 66 providing the image to a user of the device.

Detection module 74 is enclosed within the Dewar vessel 48, and receives the focused invisible infrared light 14 from the scene to be viewed. This module 74 includes the detector 50, along with a readout circuit 76 providing multiple channels of electrical image signal 78 (one channel for each detector element of the linear detector array 50, recalling the description above) to a multiplexer circuit (MUX) 80. The MUX 80 provides the electrical interface output 52 in the form of a serial analog image signal. Detector module 74 also includes a driver circuit 82 providing control commands to the readout circuit 76. An electrically erasable programmable read-only memory (EEPROM) 84 is included in the detection module 74 to locally store and provide data on the operation of the readout circuit 76, and to provide compensation factors locally for a number of gain-control and non-uniformity compensations in connection with the infrared detector 50. As can be seen from FIG. 2, the various circuits of the module 74 have electrical interface with other modules of the device 10.

The serial analog image signals 52 provided by module 74 are received by an analog signal processor (ASP) 86 which is located in a process-and-control (P&C) module 88. A processed serial analog image signal 90 is provided by the ASP 86 to a analog-to-digital converter (ADC) 92. A resulting processed serial digital image signal 94 is provided to a timing generator 96. This timing generator 96 has an interface with the multiplexer circuit 80 to control the timing of operation of this circuit. A frame memory 98 is interfaced with the timing generator so that image information which is global to the scene being viewed may be stored and retrieved for use in providing gain adjustment, contrast, and other compensation factors for use in processing the image signals obtained from the detection module 74. Timing generator 96 also provides a system-wide timing control signal, indicated with the reference numeral 100. This timing control signal is used to operate several other features of the imaging device 10, including control of the rotational speed and position of the mirror 32 so as to achieve time-correlation of the operation of the detector 50, mirror 32, and LED array 62.

A serial digital image signal 102, compensated and time-correlated, is provided by the timing generator 96 to a display module 104. This display module 104 includes the LED projection array module 62, along with a driver circuit 106 for receiving the signal 102 and driving the individual LED's 62' in response to this signal. An electrically erasable programmable read-only memory (EEPROM) 108 has an interface with the driver circuit 106. In order to provide a user of the imaging device 10 with additional useful image information, such as spaced apart comparative-size lines for humans and various types of vehicles so that ranges can be estimated, or with a reticle of various kinds and sizes in accord with the range to an object being viewed and the use being made of the device 10 at a particular time, the display module 104 also includes another electrically erasable programmable read-only memory (EEPROM) 110 for storing such image information. This image information, as selected by the user of the device 10, is provided to a symbology generator circuit 112, which in turn provides a symbology signal 114 to the LED array 62. The array 62 includes separate light emitting diodes (LED's) for receiving the signal 114.

In order to complete this description of the imaging device 10 as illustrated in FIG. 2, it should be noted that the device 10 includes an input-output (I/O) module 116. This I/O module 116 allows a user of the device 10 to input commands via a set of externally-accessible controls 118, such as a set of momentary contact push button switches which may be operated from outside the housing of the device 10. The controls 118 have an interface with a microprocessor 120, which is part of a distributed control system also including another microprocessor 122 in the P&C module 88. The microprocessors 120 and 122 have an interface with the EEPROM's 84, 108 and 110, along with the circuits served by the data and commands stored in these EEPROM's. The microprocessor 120 has an externally-accessible data interface port 120' so that all of the data and programming stored in the microprocessors 120, 122, and the EEPROM's interfaced with these EEPROM's, and the circuits served, may be inserted and changed by access to the port 120'. Finally, it is seen that the P&C module 88 provides power input to the system from a power source, such as from a battery pack 124. A DC/DC power converter 126 provides power to various modules and components of the device 10 at appropriate voltage and current levels. One of the circuits powered from converter 126 is a controller 128 for the thermoelectric cooler 54.

Figures 3A, 3B:
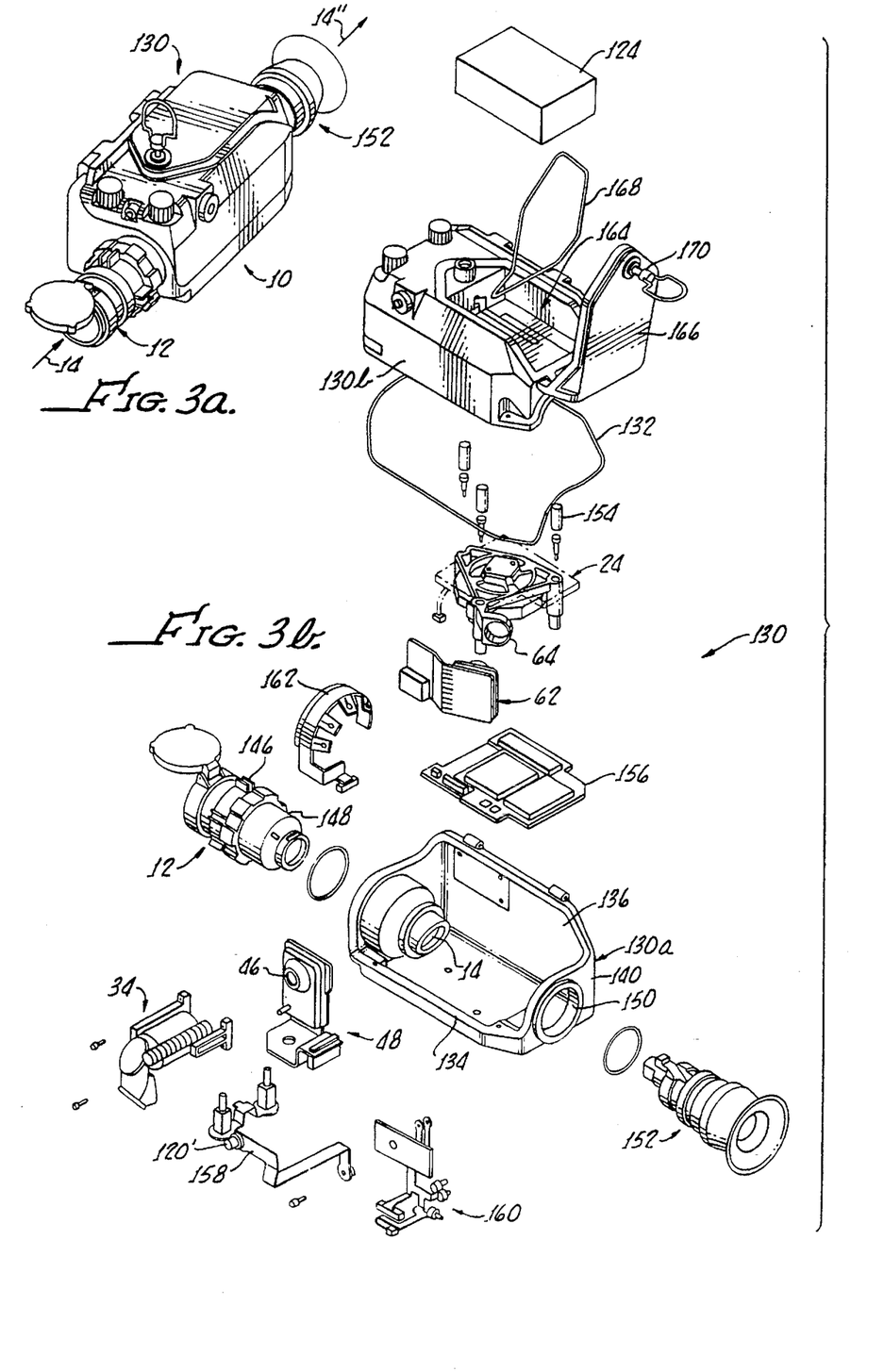
FIGS. 3a and 3b respectively provide an external view and an exploded perspective view of a thermal imaging device embodying the invention.

Turning now to FIGS. 3 and 3a, a physical embodiment of the imaging device 10 is presented in external view and in exploded perspective view, respectively. The imaging device 10 includes a two-piece chambered housing 130. This housing includes two pieces 130a and 130b which sealingly cooperate (via an intervening sealing member 132) to bound the chamber 20 within this housing. The part 130a of the housing 130 is fabricated of cast non-magnetic metal (of aluminum, for example), is somewhat L-shaped in transverse cross section, and provides a lower wall portion 134, a side wall portion 136, and an apertured pair of opposite front (138), and rear (140) wall portions. This housing part 130a provides a heat sink for the thermoelectric cooler 54, and a base (i.e., in effect, an optical bench) to which the optical and other components of the device 10 are mounted, as will be seen.

The front wall portion 138 of housing part 130a defines a reentrant portion 142 which forwardly defines a somewhat conical recess (not visible in the drawing Figures), and which at its aft end carries the window 16 in the aperture of this wall. The objective optics group 12 is carried at the front wall 138 by a housing 146 which at its aft end defines a conical portion 148 for receipt into the front recess of the housing part 130a. The housing 146 is removably engageable with the housing part 130 to connect the objective optics group 12 in its proper location, and is also removable so that optics of different power may be fitted to the sensor portion 18. At the aperture 150 of the rear wall portion 140, the ocular lens group 66 is sealingly carried in a housing portion 152.

Within the chamber 20 of the housing 130, the scanner 24 is secured to the lower wall 134 by a trio of screws 154 which each pass through a respective vertically extending hole defined centrally of a corresponding one of the three legs 28 of the scanner frame 24. These screws threadably engage respective bores defined by the lower wall 134. Captured between the lower ends of the legs of the scanner frame 24 and the lower wall 134 of the housing 130 is an electronics assembly 156. This electronics assembly 156 includes a circuit board and many of the discreet and integrated circuit devices including MUX 80 and microcontroller 122, which are necessary in order to effect the functions explained with respect to FIGS. 1 and 2. Also mounted to the lower housing part 130a, in addition to the already identified components and modules, which are indicated on FIG. 3b with their previously-introduced reference numerals, is an electronic cable assembly 158. This cable carries externally-accessible data interface port 120', the connector for which extends sealingly through a hole provided in the housing portion 130b, as is seen in this drawing figure.

A Control electronics module 160 with its own cable assembly also mounts in the housing 130 and provides the control input momentary-contact switches 118 and microcontroller 120 identified with respect to FIG. 2. Finally, received in the housing 130 and circumscribing the reentrant portion 142 of the front wall 138 is a magnetic reed switch and cable assembly 162. This cable assembly with its several magnetically-responsive reed switches is responsive to one or more magnets carried in respective locations by various ones of the objective optics groups which can be used with the basic sensor 18. These magnets are located in particular locations (i.e., in a position code) on each objective lens set in order to provide a user both with differing levels of magnification of a distant scene, and differing symbology appropriate for the particular use for which the objective lens set adapts the sensor 18. When the basic sensor 18 responds to the installation of a particular lens group, the user is provided with symbology and other internal adjustments of the operation of the sensor 18 automatically. The reed switches are able to sense the particular locations of the magnets on the lens groups (thus identifying the particular lens group) through the non-magnetic front wall portion 138 of the housing 130. Thus, no physical input is necessary from an operator to identify a particular lens group to the sensor 18, and the chamber 20 remains sealed.

Viewing now the housing portion 130b, it is seen that this housing portion defines a battery compartment recess 164 at an aft portion of the housing 130. This recess opens both upwardly and rearwardly on the housing part 130b. Battery 124 is received into the recess 164, and is covered sealingly in this recess by a hinged door member 166 with an intervening sealing member 168. The door 166 is somewhat L-shaped in side view, and is hinged adjacent to its rear edge to the housing part 130b. A latching device 170 is carried by the door 166 adjacent to its forward end, and is removably engageable with a recess feature of this housing part to retain the door 166 in its closed position, as is seen in FIG. 3a.

Analog Signal Processing

Multiplex and Compensation

Figure 4:
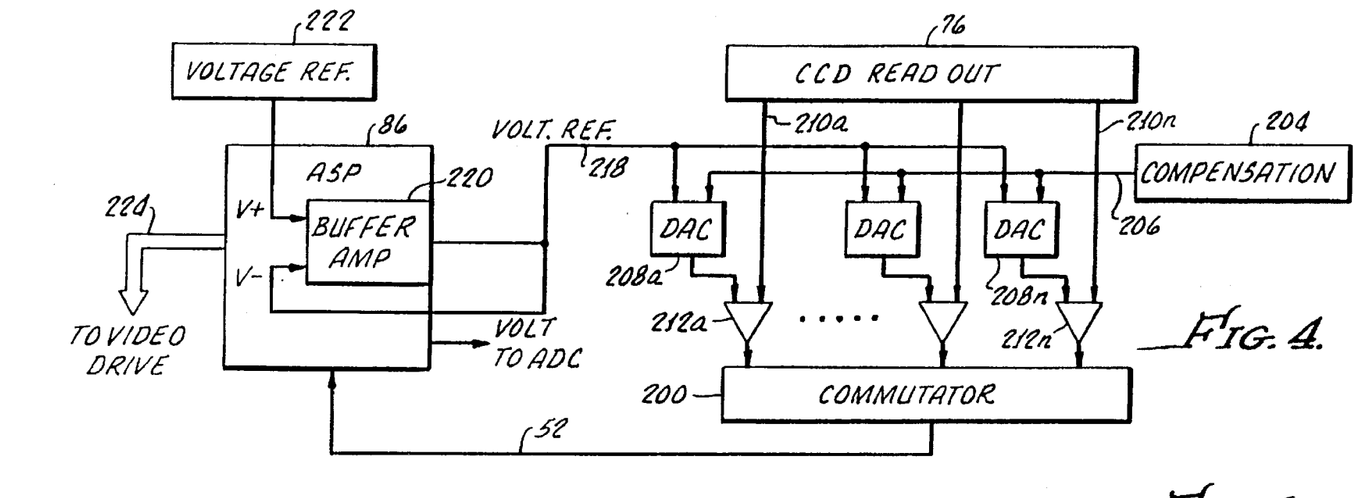
FIG. 4 is a block diagram showing one manner of use of a CMOS voltage buffer amplifier embodying principles of the present invention in the thermal imaging device of FIGS. 1–3.

Illustrated in FIG. 4 is a block diagram that illustrates in further detail certain portions of the overall block diagram of FIG. 2. The block diagram of FIG. 4 is provided to establish a background for understanding the specific application of the improved CMOS voltage buffer amplifier of the present invention to portions of the electronics of the above-described thermal imaging system.

As shown in FIG. 2 and described above, the CCD readout 76 provides multiple channels of analog electrical image signal to a multiplexer circuit, generally indicated in FIG. 4 as including a commutator 200. The commutator provides an output, which is a serial analog image signal, via a line 52 to the analog signal processor (ASP) 86, as previously described. For the purpose of providing compensation for "global variations" or variations in the general level of background radiation, and, in addition, to provide for non-uniformity compensation that correct for variations of output level from one CCD sensor to the next, there is provided compensation circuitry 204, which may include the electrically erasable programmable read only memory 84 that provides desired compensation factors for the individual CCD analog readouts. The compensation is calculated and provided in digital form on a line 206 to each of a group of individual digital to analog converters (DAC) 208a–208n. The analog outputs of the digital to analog converters are each combined with an individual one of the analog outputs 210a–210n from the several sensors of the CCD array in respective summing amplifiers 212a–212n, the outputs of which are commutated or multiplexed by a commutator 200 to provide the serial analog output on line 52.

Digital to analog converters 208 are provided with a reference voltage on a line 218 that feeds a reference voltage signal, such as a 4 volt reference for example, to each of the individual DACs.

The provision of this voltage reference signal on line 18 is the function of a CMOS voltage buffer amplifier 220 that embodies principles of the present invention.

Figure 5A:
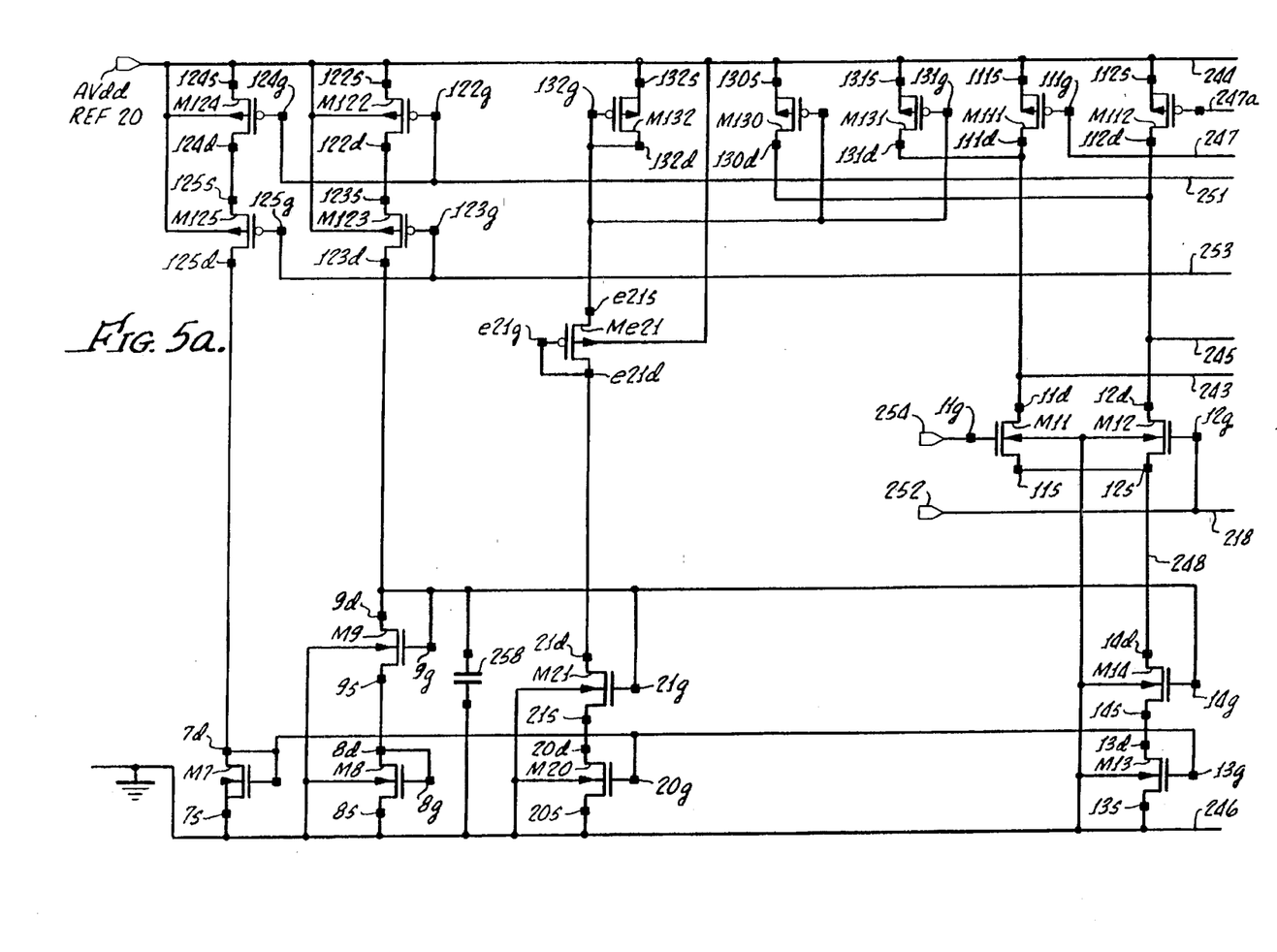
FIGS. 5a and 5b collectively show a specific circuit of a CMOS voltage buffer amplifier embodying principles of the present invention.
Figure 5B:
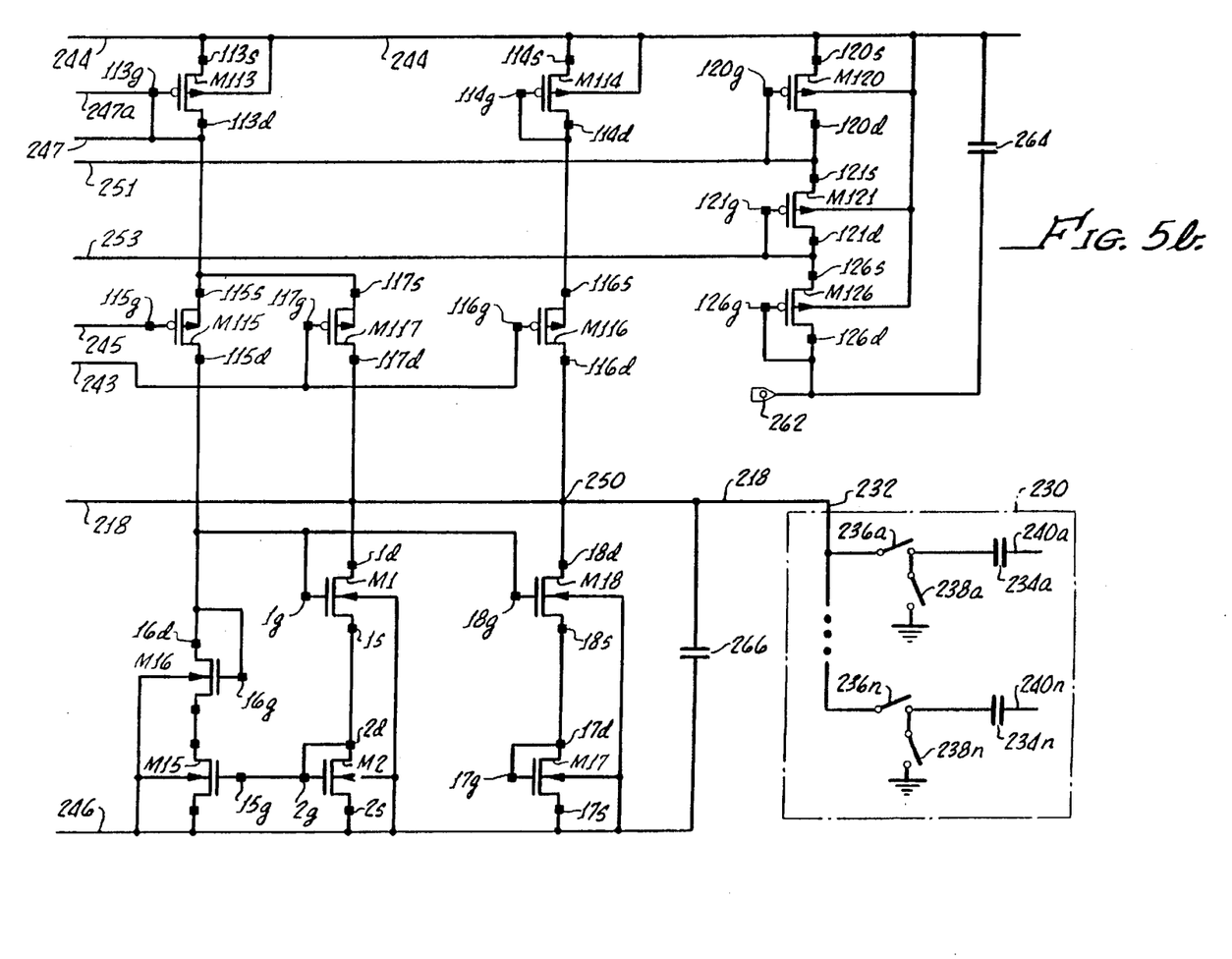

Buffer amplifier 220, the circuit of which is shown in FIGS. 5a and 5b and described below, is contained in and is actually a part of the analog signal processing circuit 86, which receives a reference voltage level from an external voltage source 222. The analog signal processor not only provides the voltage reference on line 218 for the DACs 208, but also provides a voltage reference to analog to digital converter and timing circuits of other parts of the electronics, as described above. In addition, the output of the analog signal processor is provided via lines 224 to the video drive for the several LEDs.

It may be noted that the analog signal processor 86 may incorporate one relatively large circuit board containing several of the electronic functions, all formed on the same circuit board by conventional CMOS processing. Accordingly, in addition to the other common advantages of CMOS processing, namely sharper transitions and lower power dissipation, the CMOS circuit of the amplifier of the present invention is more readily made and less costly because it may be made as part of a larger circuit, such as the described analog signal processor. Effectively, the CMOS amplifier is merely made a part of the larger CMOS circuit design.

In the particular imaging system described above, the digital analog converters 208 are driven as switched capacitors, which, in the usual manner of switched capacitor operation, include capacitors that are selectively charged and discharged through a group of input/output switches in successive half cycles of each timing cycle (see FIG. 5b, described below). The amplifier of the present invention provides charging current for these switched capacitors.

Amplifier Circuit

FIGS. 5a and 5b, when placed side by side, with FIG. 5a to the left, together comprise a detailed circuit diagram of CMOS voltage buffer amplifier 220 embodying principles of the present invention. Also illustrated in FIG. 5b in the dotted box 230 are portions of a switched capacitive load which may in fact comprise portions of the digital analog converters 208 of FIG. 4. In operation of these switched capacitors, a fixed reference voltage is fed in parallel on a line 218 to each of capacitors 234a–234n via a plurality of input switches 236a–236n and a plurality of grounding switches 238a–238n. A similar pair of output and grounding switches (not shown) are provided at capacitor output lines 240a–240n. Each capacitor is controlled by individually actuating one or more of the switches connected to both capacitor plates, as is well known in the art.

All of the transistors contained in the circuit diagram of FIGS. 5a and 5b are CMOS field effect transistors (FET), being either of a P-channel type (wherein the arrow adjacent the channel points away from the transistor channel, e.g., transistor body) or an N-channel device (wherein the arrow adjacent the body points toward the transistor body). The transistors are numbered M1–M132 (with certain numbers omitted), and each of the transistor electrodes or nodes are designated with a like number followed by the letter "g" for transistor gate, the letter "s" for transistor source, and the letter "d" for transistor drain. Thus, for example, transistor M11 is an N-channel transistor, having a gate 11g, a source 11s, and a drain 11d.

A high voltage rail, or common voltage source for all of the transistors, is indicated by the upper horizontal line 244. A ground rail, or common ground line, is indicated at the lower portion of the figure by reference numeral 246. Rail 244 is established at plus 10 volts, for example. All of the bodies of the P-type transistors (except transistors M115, M117 and M116) are connected to the positive voltage source on line 244, and all of the channels of the N-channel transistors are connected to ground. The bodies of transistors M115, M117 and M116 are connected to their sources.

A differential pair of N-channel input transistors M11 and M12 (FIG. 5a) have their sources 11s,12s connected together, and thence connected to ground via a line 248 and N-channel transistors M14,M13 connected in series between the sources 11s and 12s and ground. The drains 11d,12d of transistors M11 and M12 are connected in series positive voltage through P-channel load transistors M111 and M112, respectively, and also to parallel paths through P-channel transistors M131 and M130, respectively. Transistor M131 is connected across transistor M111, and transistor M130 is connected across transistor M112. Transistors M131 and M130 are physically much larger than their corresponding transistors M111 and M112 so that approximately ⅙th of the current flowing through each of transistors M11 and M12 will flow through their load transistors M111 and M112, respectively, whereas ⅚th of the current flowing through M11 and M12 will flow through the parallel transistors M131 and M130, respectively. In this example transistors M130,131 are each 150 microns long by 20 microns wide, whereas transistors M111,M112 are each 25 microns long and 5 microns wide. Relative physical sizes of the several transistors are important from the considerations of the amount of current flow, capacitance and transistor speed. For example, larger transistors M130,M131 carry much larger currents than M111,M112. The following table lists the transistor sizes for each of the transistors of the exemplary circuit described below. Dimensions are given in microns, with the first number denoting the length of the transistor and the second number denoting the width, so that the number 150/20, for example for transistor M130, denotes a transistor having a length of 150 microns and a width of 20 microns.

TABLE

| FET SIZES IN MICRONS | | | |
|---|---|---|---|
| FET | SIZE | FET | SIZE |
| M1 | 25/3 | M112 | 25/5 |
| M2 | 100/5 | M113 | 200/5 |
| M7 | 50/6 | M114 | 800/5 |
| M8 | 50/6 | M115 | 25/3 |
| M9 | 50/3 | M116 | 200/3 |
| M11 | 1000/4 | M117 | 25/3 |
| M12 | 1000/4 | M120 | 25/10 |
| M13 | 700/6 | M121 | 25/3 |

TABLE-continued

| FET SIZES IN MICRONS | | | |
|---|---|---|---|
| FET | SIZE | FET | SIZE |
| M4 | 700/3 | M122 | 50/10 |
| M15 | 100/5 | M123 | 50/3 |
| M16 | 25/3 | M124 | 50/10 |
| M17 | 800/5 | M125 | 50/3 |
| M18 | 200/3 | M126 | 25/10 |
| M20 | 25/6 | M130 | 150/20 |
| Me21 | 10/5 | M131 | 150/20 |
| M21 | 25/3 | M132 | 14/20 |
| M111 | 25/5 | | |

In general, as is well known, the smaller the transistor, that is, the shorter its length and the smaller its width, the faster it operates, but the less current it can carry. Further, the larger the transistor the greater its capacitance. Accordingly, there is a tradeoff in selecting transistor physical size between the desirability (in certain arrangements) of carrying more current, the desirability of higher speed and of lower capacitance. These tradeoffs are employed in the design of the described circuit to enhance speed and output currents. Relative sizes of the several transistors, as indicated in the table above, are important design considerations.

Returning to the circuit description, the drain electrodes 11d and 12d of the input differential pair M11 and M12 are connected respectively, via lines 243,245, to the gates 117g, 115g (FIG. 5b) of a second stage pair of P-channel transistors M117 and M115, respectively. The latter have their source electrodes 115s,117s connected together and to the high voltage line 244 through a P-channel transistor M113 that provides a load for the transistor pair M115 and M117. The source electrodes 115s and 117s are also connected via line 247 to gates 111g and 113g of the P-type transistors M111 and M112, thereby closing a loop from the second stage transistors M115, M117 to the load transistors M111, M112 of the first input pair M11, M12. The drain 115d of transistor M115 is connected to ground through a pair of series connected active load N-channel transistors M16, M15, of which M16 has its gate electrode 16g connected to its drain electrode 16d so that M16 acts as a diode. Similarly, the drain 117d of transistor of M117 is connected to ground through a pair of series connected active load N-channel transistors M1 and M2, of which the gate 2g of M2 is connected to its drain 2d to cause this transistor to act as a diode.

A current enhancing P-channel transistor M116 has its source 116s connected to the positive voltage through a P-channel transistor M114 that has its gate 114g connected to its drain 114d, so that this will act as diode. A pair of series connected N-channel transistors M18,M17 are connected between the drain 116d of transistors M116 and ground, with the gate of transistor M17 connected to its drain. The gate electrodes 116g and 117g of transistor M116 and M117 are both connected, via line 243, to the drain electrode 11d of input transistor M11 and both drain electrodes 117d and 116d are connected to the output terminal 250 of the amplifier so as to provide a pair of parallel output current paths connected to the amplifier output terminal 250. The latter is connected back, via line 218, to an input 252 (FIG. 5a) at the gate 12g of transistor M12 of the differential input pair. Gate 11g of the other transistor of the differential input pair M11, M12 is connected to a fixed level input, such as, for example, plus 4 volts at input 254.

Transistors M114, M116, driven by the voltage at the drain 11d of M11, form a first current boost circuit connected to output terminal 250, and transistors M17,M18, of which M18 is driven by the voltage at the drain of M117, form a second current boost circuit connected to the output terminal 250. Thus, the output terminal is connected to the four high impedance drain electrodes 117d, 116d, 1d and 18d of M117, M116, M1 and M18, respectively.

Additional FETs are provided in the circuit for appropriate biasing of the amplifier transistors, as will be apparent to those skilled in the art. Thus, a pair of series connected P-channel transistors M124 and M125 are connected between the positive voltage and ground through an N-channel transistor M7, having its gate 7g connected to its drain 7d. A pair of series connected P-channel transistors M122 and M123 are connected between the high voltage line 244 and ground through a second pair of series connected N-channel transistors M9 and M8, of which M8 has its gate electrode 8g connected to its drain electrode 8d. A capacitor 258 is connected across transistors M9 and M8 between ground and the drain electrode 9d of transistor M9. A pair of series connected P-channel transistors M132 and Me21 is connected between the high voltage line 244 and ground through a pair of N-channel transistors M21 and M20. Transistor Me21 (to be distinguished from transistor M21) has a source e21s, a gate e21g, and a drain e21d which is connected to its gate.

Referring to FIG. 5b, additional biasing transistors include P-channel transistors M120, M121 and M126, all connected in series between the positive voltage 244 and a terminal 262. An external current is applied to terminal 262 for internal bias. Transistors 121 and 126 each has its gate connected to its drain, and a capacitor 264 is connected across the transistors M120, M121, and M126 between the positive voltage and the drain 126d of transistor M126.

The gates of biasing transistors M124, M122 are connected, via a line 251, to the gate of transistor M120, and to the drain 120d and source 121s of transistors M120 and M121. The gates 125g and 123g of transistors M125 and M123 are connected, via a line 253, to the drain 122d and source 126s of transistors M121 and M126.

Gates 9g and 21g of biasing transistors M9 and M21 are connected to the gate 14g of transistor M14, and gates 7g and 20g of biasing transistors M7 and M20 are connected to the gate 13g of transistor M13. Drain 132d and source e21s of biasing transistors 132 and Me21 are connected to the gates 130g and 131g of the current strip transistors M130, M131.

Transistors M11 and M12 are the input differential pair to this two-stage amplifier, having a moderate quiescent current in the order of about 370 micro amps. A previously mentioned, the input to the gate 12g of transistor M12 is connected to the output node 250 of the amplifier, and the input to gate 11g of transistor M11 is a steady 4 volts. As mentioned above, because load transistors M130 and M131 are larger than the load transistors M112, M111 (connected in parallel with M112 and M111, respectively), the pair M130 and M131 effectively strip away most (in the order of ⅝ths) of the current flowing through the input transistor pair M11, M12. The remaining current drives the active loads M111,M112 of the input pair, with all of the current of both of these passing through the biasing transistors M14, M13.

A second stage of the amplifier is provided by transistors M115 and M117, which, together M111, M112 and M113, form the second stage differential amplifier that is driven by the output currents of the first stage transistors M11 and M12.

The second stage differential pair M115 and M117, together with their load transistors M15, M16 and M2 and M1, effectively form a single stage operational amplifier having a differential input and a single ended output.

M116 and M114, together with M17 and M18, provide parallel current paths and effectively mirror the currents flowing through the transistor M117 of the second stage and transistor M115. It should be noted that M116 (200/3 microns) is considerably larger than M117 (25/3 microns), and further that M114 (800/5 microns) is several times larger than M116 (200/3 microns), with both M17 (800/5 microns) and M18 (200/3 microns) being larger than their corresponding transistors M1 (25/3 microns) and M2 (100/5 microns). A first pair of parallel output currents are provided through both M117 and M116 and combined at output node 250, with a second pair of parallel currents through the transistor pair M1,M2 in parallel with pair M18,M17.

The diode connected transistors M114 and M17 help to set DC levels for biasing of transistors M116 and M18, respectively- and, furthermore, reduce the Miller effect by means local feedback to increase frequency of secondary poles.

The differential second stage amplifier FETs M115, M117, together with their active load transistors M15, M16 and M2, M1,exhibit significantly lower offsets than prior single-ended input second stage amplifiers because the PMOS differential pair can be much better matched.

Use of active loads, such as M111 and M112 for the first stage (M11 and M12), in the past has limited the output peak current to twice the value of the output quiescent current. However, the use of parallel current paths through transistors M130 and M131 that strip the majority of the bias current through input transistors M11 and M12 enables a much greater output peak current.

Steady state currents through load transistors M111 and M112 are equal to each other and equal to about ⅛ of the total current through the input differential pair M11 and M12.

The currents flowing through M115 and M117 are also equal to each other, and, in the arrangement described, approximately four times greater than the currents flowing through M111 and M112. Transistors M111 and M112 mirror transistor M113. Current through transistor M113 is split between transistors M115 and M117. Transistor M113 is approximately eight times larger than transistors M111 and M112 so that a larger current flows through transistor M113.

When the switched capacitor load is activated (e.g., one or more load capacitors starts to draw charging current), a large peak current is drawn by the load, and the voltage at output node 250 drops. Accordingly, there is a net positive differential, an effective net positive increase, in the inputs to the two gates 11g, 12g of the differential pair M11, M12. Current in the N-channel FET M111 increases, and current in N-channel FET M12 decreases. The increase in current through M11 provides a lower voltage at the gate of P-channel transistor M117 (due to the voltage drop across M111 and M131), which, accordingly, carries an increased current. The decrease in current flow through input transistor M12 yields an increased voltage at gate 115g of transistor M115, thereby decreasing the current through M115.

For small voltage differences across the gates 11g and 12g of the differential pair M11 and M12, the currents in load transistors M111 and M112 remains effectively constant. When the load draws no current the two voltage inputs are equal. For larger voltage differences across gates 11g and 12g (as will occur when the load draws a large current spike), M115 will start to turn off and current flow through M117 increases, with transistor M117 and its load transistors M113 and M111 acting as a Wilson current mirror, with a current gain of 8. In other words, the current flow through transistor M117 increases in proportion to the increase in current through transistor M11.

With the loop M117, M113 and M111 acting as a current mirror of current through transistor M11, the amplifier acts as a single-stage trans-impedance amplifier. That is, this single-state trans-impedance amplifier is effectively a voltage controlled current source having a lower open loop gain. The voltage levels, such as at the gate of M117, do not reach the value of the voltage source at line 244 (e.g., do not go to the rail), but this gate voltage only moves enough to match the current in input transistor M11. The gate voltage on the gate 117g of transistor M117 increases proportionately to the increase in current through M11. Thus the output stage M117 is still in a linear mode.

In the described arrangement the slew rate, that is, the rate of change of voltages on the several transistor nodes, is determined by the load capacitance and the output current (when the capacitive load is activated), and the first stage remains linear during the rise of output current.

M116 and M114 effectively mirror transistors M117 and M113 as the gates 117g and 116g are driven by the same voltage at the drain 11d of transistor M11. This dual (parallel) current flow through M117 and M116 significantly boosts the total output current. By driving the gate of M116 (a relatively smaller transistor) instead of driving the gate of M114 (a relatively large transistor), load capacitances on internal high impedance nodes are reduced. As previously mentioned, the circuit output, at node 250, is provided at the high impedance drains 117d, 116d, 18d and 1d of all four transistors M117, M116, M18 and M1.

Figure 6:
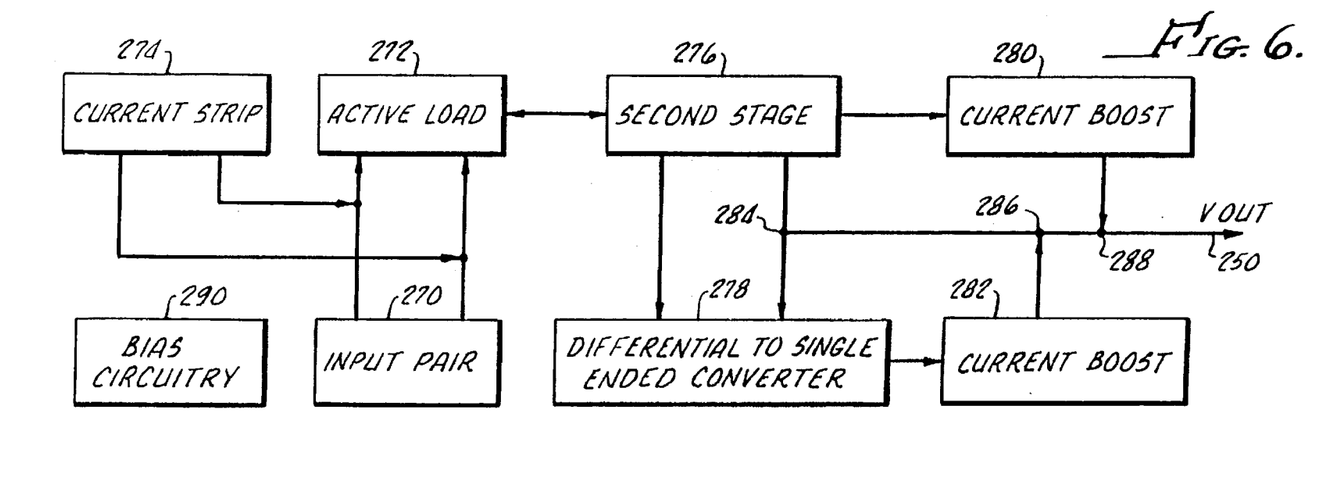
FIG. 6 is a functional block diagram of the amplifier of FIGS. 5a and 5b.

FIG. 6 comprises a functional block diagram that effectively summarizes certain important features of the circuitry of the CMOS voltage buffer amplifier shown in detail in FIGS. 5a and 5b. An input circuit 270, comprised of the differential transistor pair M11 and M12, conducts through its active load 272 (M111,M112). The majority of the current through the input pair, however, is passed through a parallel current stripping circuit 274 comprised of FETs M130 and M131. The output of the active load, at the drain electrodes of transistors M111 and M112, drives the second stage amplifier 276 composed of FETs M115 and M117, which in turn drive a differential to single end converter 278 composed of transistors M15, M16, M1 and M2. Current flowing through the second stage 276 is augmented (boosted) by a parallel current boost circuit 280 composed of transistors M114 and M116. Similarly, the output of the differential to single ended converter 278 is applied to a current augmenting (boost) circuit 282 composed of transistors M18 and M17. The output current, at terminal 250, effectively is the sum of the current from the second stage, from the differential to single end converter, and from the two current boost circuits. Thus, in the block diagram of FIG. 6 points 284, 286 and 288 respectively correspond to the very high impedance drain nodes 1d and 117d, 18d and 116d, which are all connected to the common output terminal 250. Block 290 represents the bias circuitry, which includes transistors M124, M122, M125, M123, Me21, M7, M9, M8, M21, M20, M120, M121 and M126, as shown in the circuitry of FIGS. 5a and 5b.

Accordingly, it will be seen that the described circuit provides a CMOS voltage buffer for a switched capacitive load, which voltage buffer has a low quiescent current and a high peak output current. The circuit can drive a 0.01 micro farad load and return to a current flow that is within less than 0.1% of its quiescent current in less than one to two microseconds. The circuit employs low quiescent current that conserves power yet provides a sufficiently high peak output current as is necessary for obtaining a short settling when driving a large capacitative load.

The output of the circuit is provided from high impedance nodes, thereby allowing the capacitor loads to perform more efficiently and more effectively. Use of CMOS technology allows incorporation of the described voltage buffer amplifier into larger CMOS integrated circuitry on the same chip. The use of two stages for amplification provides greater accuracy and lower systematic offsets, and, of course, the very low quiescent current uses low power, but retains the capability of providing high peak output current when required.

What is claimed is:

1. A CMOS voltage buffer amplifier comprising:
    an input pair of field effect transistors, the field effect transistors defining a differential pair;
    an active load connected with said transistors;
    a current strip circuit connected with said input pair of transistors for providing a path for a major portion of current flowing through said input pair of transistors;
    a second stage amplifier comprising a pair of field effect transistors, the second stage field effect transistors also defining a differential pair, where the biasing current of the second stage varies in accordance with the current flowing through the strip circuit; and
    output means connected with said active load.

2. The voltage buffer amplifier of claim 1 wherein said output means includes an output terminal, and a current boost circuit augments current flow through said output terminal.

3. The voltage buffer amplifier of claim 2 wherein said output means includes a second current boost circuit which augments current flow through said output terminal.

4. The voltage buffer amplifier of claim 1 wherein said output means includes an output terminal, and the second stage is connected between said output terminal and said active load, said second stage amplifier being connected to be partially driven by said active load.

5. The voltage buffer amplifier of claim 4 including a differential to single ended converter connected between said output terminal and said second stage amplifier.

6. The voltage buffer amplifier of claim 5 including a current boost circuit connected between said output terminal and said differential to single ended converter.

7. The voltage buffer amplifier of claim 6 including a second current boost circuit connected between said output terminal and said second stage amplifier.

8. The voltage buffer amplifier of claim 7 wherein said second stage amplifier, said current boost circuit and said second current boost circuit, have outputs connected in common to said amplifier output terminal.

9. The voltage buffer amplifier circuit of claim 8 including a switched capacitative load connected to said output terminal, said output terminal being connected to the input terminal of one of said input pair of transistors, the other of said input pair of input transistors having an input terminal connected to a source of fixed potential.

10. A CMOS voltage buffer amplifier comprising:
    a differential pair of input transistors including a first field effect transistors (M11) and a second field effect transistor (M12);

an active load connected to said first and second field effect transistors comprising a third field effect transistor (M111) connected to said first field effect transistor, and a fourth field effect transistor (M112) connected to said second field effect transistor;

a current strip circuit comprising a fifth field effect transistor (M131) connected to said first field effect transistor, and a sixth field effect transistor (M130) connected to said second field effect transistor, and a second differential stage comprising seventh and eighth field effect transistors (M117, M115) connected to be driven respectively said first and second transistors (M11, M12), are a biasing current for the second differential stage varies in accordance with the current flowing through the current strip circuit.

11. The CMOS voltage buffer amplifier of claim 10 wherein said third (M111) and fifth (M131) transistors are connected in parallel with each other and in series with said first transistor between points of first and second potential, and wherein said fourth (M112) and sixth (M130) transistors are connected in parallel with each other and in series with said second transistor (M12) between said points of first and second potential.

12. The CMOS voltage buffer amplifier of claim 11 including a common bias circuit (M14) connected to both said first and second transistors (M11 and M12).

13. The CMOS voltage buffer amplifier of claim 12 wherein said first and second transistors each includes a source electrode, and wherein said common bias circuit comprises a bias field effect transistor (M14) connected to both said source electrodes.

14. The CMOS voltage buffer amplifier of claim 13 wherein said load transistors (M111 and M112) are many times smaller than said current strip transistors (M131 and M130).

15. The CMOS voltage buffer amplifier of claim 14 including an amplifier output terminal and a current boost circuit comprising a ninth field effect transistor (M116) connected to be driven by said first transistor (M11), said seventh field effect transistor (M117) and said ninth field effect transistor (M116) having drain electrodes connected in common to said amplifier output terminal.

16. The CMOS voltage buffer amplifier of claim 15 including a second current boost circuit comprising a tenth transistor (M18) connected to be driven by one of the transistors (M115) of said second differential output stage, the tenth transistor (M18) having a drain terminal connected to said drain electrode connected in common with said seventh and ninth field effect transistors (M117, M116).

17. The CMOS voltage buffer amplifier of claim 16 including a switched capacitative load connected to said output terminal, said output terminal being connected to a gate electrode of one of said differential pair of input transistors (M12), the gate electrode of the other of said differential pair of input transistors (M11) being connected to a source of fixed potential.

18. An imaging system comprising:
input image optics;
a detector connected to said optics;
an analog signal processor connected to said detector for processing received signals and including a plurality of switched capacitor circuits;
an output display responsive to said signal processor; and
a CMOS voltage buffer amplifier connected to provide a voltage reference for said switched capacitor circuits, said CMOS voltage buffer amplifier comprising:

an input pair of field effect transistors;
an active load connected with said transistors;
a current strip circuit connected with said input pair of transistors for providing a path for a major portion of current flowing through said input pair of transistors; and
output means connected with said active load.

19. The imaging system of claim 18 wherein said detector comprises an array of infrared sensors, and wherein said analog signal processor comprises a multiplexer having a plurality of channels each connected individually to a respective one of said infrared sensors for providing an analog output signal indicative of an infrared signal received in an individual one of said channels, a plurality of digital to analog converters each individual to a respective one of said multiplexer channels and each having an analog output combined with the analog signal in a respective one of the individual multiplexer channels, each said digital to analog converter having a signal compensating digital input, each said digital analog converter including a switched capacitor, said output terminal of said CMOS voltage buffer amplifier being connected to provide a voltage reference for all of said switched capacitors.

20. The imaging system of claim 19 wherein said output means includes an output terminal and a second stage amplifier connected between said output terminal and said active load, said second stage amplifier comprising a second pair of transistors including second and third field effect transistors connected to be driven by said active load.

21. The imaging system of claim 20 including a differential to single ended converter connected between said voltage output terminal and said second stage amplifier.

22. The imaging system of claim 21 including a current boost circuit connected between said output terminal and said differential to single ended converter.

23. A CMOS voltage buffer amplifier comprising:
an input defined as a differential pair of field effect transistors;
an active load connected with said transistors;
a current strip circuit in series with the input and in parallel with the active load, the strip circuit providing a path for a substantial portion of current flowing through said input;
a second stage differential amplifier connected to be driven by said active load, where current flowing through the second stage varies in accordance with current flowing through the strip circuit;
an output terminal for said amplifier; and
a current boost circuit connected between said second stage and said output terminal, said second stage being connected to said output terminal.

24. The CMOS voltage buffer amplifier of claim 23 including a differential to single ended converter connected between said output terminal and said second stage amplifier.

25. The CMOS voltage buffer amplifier of claim 24 including a second current boost circuit connected between said output terminal and said differential to single ended converter.

26. The CMOS voltage buffer amplifier of claim 25 wherein said second stage amplifier, said first mentioned current boost circuit and said second current boost circuit have outputs connected in common to said amplifier output terminal.

* * * * *